United States Patent
Kuroiwa et al.

(10) Patent No.: US 8,895,463 B2
(45) Date of Patent: Nov. 25, 2014

(54) GLASS SUBSTRATE FOR CU-IN-GA-SE SOLAR CELL AND SOLAR CELL USING SAME

(71) Applicant: Asahi Glass Company, Limited, Chiyoda-ku (JP)

(72) Inventors: Yutaka Kuroiwa, Chiyoda-ku (JP); Yuichi Yamamoto, Chiyoda-ku (JP); Tomomi Abe, Chiyoda-ku (JP); Tetsuya Nakashima, Chiyoda-ku (JP); Yasushi Kawamoto, Chiyoda-ku (JP); Shigeru Niki, Tsukuba (JP); Shogo Ishizuka, Tsukuba (JP)

(73) Assignee: Asahi Glass Company, Limited, Tokyo (JP)

( * ) Notice: Subject to any disclaimer, the term of this patent is extended or adjusted under 35 U.S.C. 154(b) by 14 days.

(21) Appl. No.: 13/751,764

(22) Filed: Jan. 28, 2013

(65) Prior Publication Data
US 2013/0160845 A1 Jun. 27, 2013

Related U.S. Application Data

(63) Continuation of application No. PCT/JP2011/066878, filed on Jul. 25, 2011.

(30) Foreign Application Priority Data
Jul. 26, 2010 (JP) ................................. 2010-167026

(51) Int. Cl.
*C03C 3/083* (2006.01)
*C03C 3/085* (2006.01)
(Continued)

(52) U.S. Cl.
CPC ......... *H01L 31/02327* (2013.01); *Y02E 10/541* (2013.01); *H01L 31/0322* (2013.01); *C03C*
(Continued)

(58) Field of Classification Search
CPC ........ C03C 3/083; C03C 3/085; C03C 3/087; C03C 3/093; C03C 3/078; C03C 21/005; C03C 21/001; C03C 21/002

USPC ................ 501/68, 69, 70, 72; 65/400, 30.13, 65/30.14, 114
See application file for complete search history.

(56) References Cited

U.S. PATENT DOCUMENTS

| | | | |
|---|---|---|---|
| 2010/0087307 A1* | 4/2010 | Murata et al. | 501/67 |
| 2011/0203645 A1* | 8/2011 | Kuroki et al. | 136/252 |
| 2012/0199203 A1 | 8/2012 | Nishizawa et al. | |

FOREIGN PATENT DOCUMENTS

| | | |
|---|---|---|
| JP | 63-159238 | 7/1988 |
| JP | 11-135819 | 5/1999 |

(Continued)

OTHER PUBLICATIONS

Mochel et al. Strengthening of Glass Surfaces by Sulfur Trioxide Treatment. Journal of the American Ceramic Society. vol. 49, Issue 11. Nov. 1966, pp. 585-589.*

(Continued)

*Primary Examiner* — Noah Wiese
(74) *Attorney, Agent, or Firm* — Oblon, Spivak, McClelland, Maier & Neustadt, L.L.P.

(57) ABSTRACT

A glass substrate for a CIGS solar cell, having high cell efficiency and high glass transition temperature is provided. The glass substrate for a vapor-deposited CIGS film solar cell has a glass transition temperature of at least 580° C. and an average thermal expansion coefficient of from $70 \times 10^{-7}$ to $100 \times 10^{-7}$/° C., wherein the ratio of the average total amount of Ca, Sr and Ba within from 10 to 40 nm in depth from the surface of the glass substrate to the total amount of Ca, Sr and Ba at 5,000 nm in depth from the surface of the glass substrate is at most 0.35, and the ratio of the average Na amount within from 10 to 40 nm in depth from the surface of the glass substrate after heat treatment to such average Na amount before the heat treatment is at least 1.5.

16 Claims, 1 Drawing Sheet

(51) Int. Cl.
H01L 31/0232 (2014.01)
H01L 31/032 (2006.01)
C03C 3/087 (2006.01)
C03C 23/00 (2006.01)
H01L 31/048 (2014.01)

(52) U.S. Cl.
CPC ...... *3/087* (2013.01); *C03C 23/008* (2013.01); *H01L 31/0488* (2013.01)
USPC .............................................. 501/69; 501/68

(56) References Cited

FOREIGN PATENT DOCUMENTS

| | | | | |
|---|---|---|---|---|
| JP | 11-278875 | 10/1999 | | |
| JP | 2007-204295 | 8/2007 | | |
| JP | 2010-59038 | 3/2010 | | |
| WO | WO/2010/050591 | * | 5/2010 | .............. H01L 31/04 |

OTHER PUBLICATIONS

International Search Report issued Oct. 18, 2011 in PCT/JP2011/066878 filed Jul. 25, 2011.

* cited by examiner

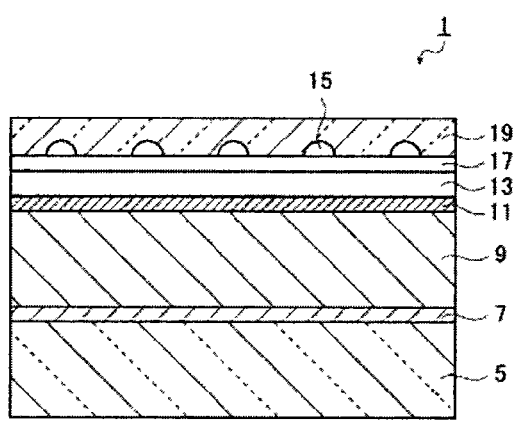

GLASS SUBSTRATE FOR CU-IN-GA-SE SOLAR CELL AND SOLAR CELL USING SAME

FIELD OF INVENTION

The present invention relates to a glass substrate for a solar cell having a photoelectric conversion layer formed between glass sheets, and a solar cell using such a glass substrate. More specifically, the present invention relates to a glass substrate for a Cu—In—Ga—Se solar cell typically having a glass substrate and a cover glass as the glass sheets and having a photoelectric conversion layer containing an element of group 11, group 13 or group 16 as the main component, which photoelectric conversion layer is formed between the glass substrate and the cover glass; and a solar cell using such a glass substrate.

BACKGROUND OF INVENTION

Since group 11-13 and group 11-16 compound semiconductors having the chalcopyrite crystal structure, and group 12-16 compound semiconductors having the cubic or hexagonal crystal structure have large absorption coefficients for light having a wavelength within a range of from the visible region to the near-infrared, such compound semiconductors are expected as materials for highly-efficient thin-film solar cells. Representative examples of such compound semiconductors include $Cu(In,Ga)Se_2$ (hereinafter also referred to as "CIGS" or "Cu—In—Ga—Se") and CdTe.

In the field of CIGS thin-film solar cells, soda-lime glass has been used as a substrate to obtain a solar cell since it is inexpensive and its thermal expansion coefficient is close to that of a CIGS compound semiconductor.

Further, for the purpose of obtaining a solar cell having high efficiency, a glass material having resistance to a high temperature for heat treatment has also been proposed (Patent Document 1).

PRIOR ART DOCUMENTS

Patent Documents

Patent Document 1: JP-A-11-135819

SUMMARY OF INVENTION

Technical Problem

Over a glass substrate, a CIGS absorbing layer (hereinafter also referred to as "a CIGS layer") is formed. As disclosed in Patent Document 1, heat temperature at a higher temperature is preferred to produce a solar cell having a good cell efficiency, and the glass substrate is required to have resistance to such a high temperature. In Patent Document 1, a glass composition having a relatively high annealing point is proposed; however, the invention disclosed in Patent Document 1 does not necessarily has a high cell efficiency.

The present inventors found that the cell efficiency can be improved by increasing alkali in the glass substrate to an amount within a specific range; however, there was a problem that increase in the amount of alkali led to decrease in the glass transition temperature (Tg).

Accordingly, there has been a problem that it is difficult to obtain a glass substrate used for a CIGS solar cell which both provides high cell efficiency and has a high glass transition temperature.

The present invention is particularly to provide a glass substrate for a Cu—In—Ga—Se solar cell which both provides high cell efficiency and has a high glass transition temperature.

Solution to Problem

The present invention provides the following.

(1) A glass substrate for a vapor-deposited CIGS film solar cell, which has a glass transition temperature of at least 580° C. and an average thermal expansion coefficient of from $70\times10^{-7}$ to $100\times10^{-7}$/° C., wherein
the ratio of the average total amount (atom %) of Ca, Sr and Ba within from 10 to 40 nm in depth from the surface of the glass substrate to the total amount (atom %) of Ca, Sr and Ba at 5,000 nm in depth from the surface of the glass substrate is at most 0.35,
the ratio of the average Na amount (atom %) within from 10 to 40 nm in depth from the surface of the glass substrate after a heat treatment at 600° C. under a $N_2$ atmosphere for 1 hour to such average Na amount before the heat treatment is at least 1.5, and
the glass substrate comprises, at 5,000 nm or more in depth from the surface of the glass substrate, as represented by mass % based on the following oxides, from 53 to 72% of $SiO_2$, from 1 to 15% of $Al_2O_3$, from 0.5 to 9% of MgO, from 0.1 to 11% of CaO, from 0 to 11% or SrO, from 0 to 11% or BaO, from 2 to 11% of $Na_2O$, from 2 to 21% of $K_2O$ and from 0 to 10.5% of $ZrO_2$, provided that MgO+CaO+SrO+BaO is from 4 to 25%, CaO+SrO+BaO is from 2 to 23%, $Na_2O+K_2O$ is from 8 to 22%, and $Na_2O/(CaO+SrO+BaO)\leq1.2$.

(2) The glass substrate for a vapor-deposited CIGS film solar cell according to the above (1), wherein the ratio of the average total amount (atom %) of Ca, Sr and Ba within from 10 to 40 nm in depth from the surface of the glass substrate to the total amount (atom %) of Ca, Sr and Ba at 5,000 nm in depth from the surface of the glass substrate is at most 0.17, and in the glass substrate, at 5,000 nm or more in depth from the surface of the glass substrate, as represented by mass % based on the following oxides, $K_2O$ is from 4 to 21%, $ZrO_2$ is from 0.5 to 10.5%, and CaO+SrO+BaO is from 4 to 23%.

(3) The glass substrate for a vapor-deposited CIGS film solar cell according to the above (1) or (2), wherein the ratio of the average total amount (atom %) of Ca, Sr and Ba within from 10 to 40 nm in depth from the surface of the glass substrate to the total amount (atom %) of Ca, Sr and Ba at 5,000 nm in depth from the surface of the glass substrate is at most 0.05, the ratio of the average Na amount (atom %) within from 10 to 40 nm in depth from the surface of the glass substrate after a heat treatment at 600° C. under a $N_2$ atmosphere for 1 hour to such average Na amount before the heat treatment is at least 2.0, and in the glass substrate, at 5,000 nm or more in depth from the surface of the glass substrate, as represented by mass % based on the following oxides, CaO+SrO+BaO is from 4 to 15%, and SrO+BaO is from 0 to 8%.

(4) The glass substrate for a vapor-deposited CIGS film solar cell according to the above (1), wherein the ratio of the average Na amount (atom %) within from 10 to 40 nm in depth from the surface of the glass substrate after a heat treatment at 600° C. under a $N_2$ atmosphere for 1 hour to such average Na amount before the heat treatment is at least 2.

(5) The glass substrate for a vapor-deposited CIGS film solar cell according to the above (1) or (2), wherein the ratio of an average total amount (atom %) of Ca, Sr and Ba within from 10 to 40 nm in depth from the surface of the glass substrate to the total amount (atom %) of Ca, Sr and Ba at 5,000 nm in depth from the surface of the glass substrate is at most 0.17, the ratio of the average Na amount (atom %) within from 10 to 40 nm in depth from the surface of the glass substrate after a heat treatment at 600° C. under a $N_2$ atmosphere for 1 hour to such average Na amount before the heat treatment is at least 2.4, and in the glass substrate, at 5,000 nm or more in depth from the surface of the glass substrate, as represented by mass % based on the following oxides, CaO+SrO+BaO is from 2 to 15%, and SrO+BaO is from 0 to 10%.

(6) A solar cell comprising a glass substrate, a cover glass and a vapor-deposited Cu—In—Ga—Se absorbing layer disposed between the glass substrate and the cover glass, wherein between the glass substrate and the cover glass, at least the glass substrate is the glass substrate for a vapor-deposited CIGS film solar cell as defined in any one of the above (1) to (5).

The present invention provides a glass substrate for a solar cell which is suitably used for a solar cell comprising a glass substrate, a cover glass and a vapor-deposited Cu—In—Ga—Se absorbing layer disposed between the glass substrate and the cover glass, and between the glass substrate and the cover glass, at least the glass substrate can be used as the glass substrate for a Cu—In—Ga—Se solar cell of the present invention.

Effects of Invention

The glass substrate for a Cu—In—Ga—Se solar cell of the present invention both provides high cell efficiency and has a high glass transition temperature. By using the glass substrate for a GIGS solar cell of the present invention, it is possible to provide a solar cell having high efficiency at low cost.

The disclosure of this application is related to the subject matter disclosed in Japanese Patent Application No. 2010-167026 filed on Jul. 26, 2010, and the entire content of the disclosure of the above application is incorporated herein by reference.

BRIEF DESCRIPTION OF DRAWINGS

FIG. 1 is a cross-sectional view schematically illustrating an example of the solar cell of the present invention.

DETAILED DESCRIPTION OF INVENTION

Now, the glass substrate for a Cu—In—Ga—Se solar cell of the present invention will be described.

The glass substrate for a Cu—In—Ga—Se solar cell of the present invention is a glass substrate for a vapor-deposited Cu—In—Ga—Se solar cell, which has a glass transition temperature of at least 580° C. and an average thermal expansion coefficient of from $70\times10^{-7}$ to $100\times10^{-7}$/° C., wherein the ratio (hereinafter also referred to as "the ratio of the Ca+Sr+Ba in the surface layer to that in the inner portion of the glass substrate") of the average total amount (atom %) of Ca, Sr and Ba within from 10 to 40 nm in depth from the surface of the glass substrate (hereinafter also referred to as "the Ca+Sr+Ba in the surface layer of the glass substrate") to the total amount (atom %) of Ca, Sr and Ba at 5,000 nm in depth from the surface of the glass substrate (hereinafter also referred to as "the Ca+Sr+Ba amount in the inner portion of the glass substrate") is at most 0.35, the ratio of the average Na amount (atom %) within from 10 to 40 nm in depth from the surface of the glass substrate after a heat treatment at 600° C. under a $N_2$ atmosphere for 1 hour to such average Na amount before the heat treatment (hereinafter also referred to as "the ratio of Na in the surface layer of the glass substrate after to before heat treatment") is at least 1.5, and the glass substrate comprises, at 5,000 nm or more in depth from the surface of the glass substrate, as represented by mass % based on the following oxides, from 53 to 72% of $SiO_2$, from 1 to 15% of $Al_2O_3$, from 0.5 to 9% of MgO, from 0.1 to 11% of CaO, from 0 to 11% or SrO, from 0 to 11% of BaO, from 2 to 11% of $Na_2O$, from 2 to 21% of $K_2O$ and from 0 to 10.5% of $ZrO_2$, provided that MgO+CaO+SrO+BaO is from 4 to 25%, CaO+SrO+BaO is from 2 to 23%, $Na_2O+K_2O$ is from 8 to 22%, and $Na_2O/(CaO+SrO+BaO) \leq 1.2$.

The glass substrate for a Cu—In—Ga—Se solar cell is preferably a glass substrate for a vapor-deposited Cu—In—Ga—Se film solar cell.

A vapor-deposited Cu—In—Ga—Se film means that at least a part of the CIGS layer as a photoelectric conversion layer of a solar cell is film-formed by a vapor deposition method.

In the glass substrate for a CIGS solar cell of the present invention, the ratio of the Ca+Sr+Ba in the surface layer to that in the inner portion of the glass substrate is at most 0.35, preferably at most 0.3, more preferably at most 0.17, furthermore preferably at most 0.13, particularly preferably at most 0.05.

By means of the ratio of the Ca+Sr+Ba in the surface layer to that in the inner portion of the glass substrate, it is possible to compare the Ca+Sr+Ba amount in the surface layer of the glass substrate and the Ca+Sr+Ba amount in the inner portion of the glass substrate, as a relative ratio. That is, "the ratio of the Ca+Sr+Ba in the surface layer to that in the inner portion of the glass substrate is at most 0.35" means that the glass substrate is in a state where the Ca+Sr+Ba amount in the surface layer of the glass substrate is smaller than the Ca+Sr+Ba amount in the inner portion of the glass substrate, specifically, in a state where Ca, Sr and Ba atoms are depleted from the surface of the glass substrate.

The present inventors have found that due to the state (depleted state) where Ca, Sr and Ba atoms are depleted from the surface of the glass substrate, when the glass substrate for a CIGS solar cell of the present invention is used for a vapor-deposited CIGS film solar cell, in a heat treatment step (usually under a condition of under an oxygen-free atmosphere at about 600° C. for at least 1 hour) of the process for producing a solar cell, the diffusion amount of Na from the glass substrate into the CIGS absorbing layer is increased at the time of film forming of at least a part of CIGS as the photoelectric conversion layer of the solar cell by a vapor deposition method, whereby the conversion efficiency of the solar cell is improved.

This is considered because in the surface layer of the glass substrate, when Ca, Sr and Ba atoms, which prevent migration of Na, are depleted, Na becomes more likely to migrate from the inner portion of the glass substrate to the surface layer, and further, when a CIGS absorbing layer is provided on the surface of the glass substrate, Na is diffused from the surface layer of the glass substrate into the photoelectric conversion layer.

In the present invention, the reason why the Ca+Sr+Ba amount and the Na amount (atom %) in the surface layer of the glass substrate are defined by "the average total amount (atom %) of Ca, Sr and Ba within from 10 to 40 nm in depth from the surface of the glass substrate" and "the average Na amount (atom %) within from 10 to 40 nm in depth from the surface of the glass substrate" is that when Ca, Sr and Ba in this region are depleted, the diffusion of Na to the surface layer of the glass substrate after the heat treatment becomes remarkable. The amounts within from 0 to less than 10 nm were not measured in view of the compositional variability by outer air.

Further, the reason why the Ca+Sr+Ba amount in the inner portion of the glass substrate is defined by "the total amount at 5,000 nm in depth from the surface of the glass substrate" is that at such a depth, Ca, Sr and Ba are hardly depleted.

To obtain a glass substrate wherein the ratio of Ca+Sr+Ba in the surface layer to that in the inner portion of the glass substrate is at most 0.35, respective raw material components are used so that the composition of the glass substrate will be within the range specified in the present invention, a melting/fining step and a forming step are carried out in the same manner as when a conventional glass substrate for a solar cell is produced, and the $SO_2$ treatment in the present invention is carried out in the later annealing step. The composition (respective raw material components) of the glass substrate for a CIGS solar cell of the present invention and the $SO_2$ treatment in the present invention will be described in detail later.

Further, the glass substrate for a CIGS solar cell of the present invention is required to be such that the ratio of Na in the surface layer of the glass substrate after to before heat treatment is at least 1.5, preferably at least 2. The present inventors have found that the diffusion amount of Na from the glass substrate into the photoelectric conversion layer of CIGS is thereby increased during the heat treatment in the process of producing a CIGS solar cell, and when such a glass substrate is used for a CIGS solar cell, the conversion efficiency of the solar cell is improved. The ratio of Na in the surface layer of the glass substrate after to before heat treatment is more preferably at least 2.4, further preferably at least 2.5, particularly preferably at least 2.7. The upper limit of the ratio of Na in the surface layer of the glass substrate after to before heat treatment is 5. If the ratio of Na in the surface layer of the glass substrate is more than 5, the Na amount in the surface layer of the glass substrate before heat treatment will be decreased, and as a result, the diffusion amount of Na from the glass substrate into the photoelectric conversion layer of CIGS will be decreased, whereby the cell efficiency may be dropped. It is preferably at most 4.5, more preferably at most 4.

When the composition of the glass substrate is set to be within the range specified in the present invention, and the ratio of Ca+Sr+Ba in the surface layer to that in the inner portion of the glass substrate is at most 0.35, preferably at most 0.3, more preferably at most 0.17, further preferably at most 0.13, particularly preferably at most 0.05, it is possible to easily let the ratio of Na in the surface layer of the glass substrate after to before heat treatment be at least 1.5, preferably at least 2, more preferably at least 2.4, further preferably at least 2.5, particularly preferably at least 2.7.

The glass transition temperature (Tg) of the glass substrate for the CIGS solar cell of the present invention is at least 580° C. The glass transition temperature of the glass substrate for a CIGS solar cell of the present invention is higher than the glass transition temperature of soda-lime glass. The glass transition temperature (Tg) of the glass substrate for a CIGS solar cell of the present invention is preferably at least 600° C., more preferably at least 610° C., further preferably at least 620° C., particularly preferably at least 630° C., to secure the forming of the photoelectric conversion layer at a high temperature. The upper limit of the glass transition temperature is 750° C. When the glass transition temperature is at most 750° C., the viscosity at the time of melting can be moderately suppressed, and the production is thereby easy, and thus such a glass transition temperature is preferred. It is more preferably at most 700° C., further preferably at most 680° C.

The average thermal expansion coefficient of the glass substrate for a CIGS solar cell of the present invention is from $70 \times 10^{-7}$ to $100 \times 10^{-7}/°$ C. at a temperature of 50 to 350° C. If it is less than $70 \times 10^{-7}/°$ C. or more than $100 \times 10^{-7}/°$ C., the difference in thermal expansion from e.g. the CIGS layer becomes too large, and defects such as peeling will likely to arise. Further, when a solar cell is assembled (specifically, when a glass substrate having a CIGS absorbing layer and a cover glass are bonded together by heat), the glass substrate may become more likely to be deformed. It is preferably at most $95 \times 10^{-7}/°$ C., more preferably at most $90 \times 10^{-7}/°$ C.

Further, it is preferably at least $73 \times 10^{-7}/°$ C., more preferably at least $75 \times 10^{-7}/°$ C., further preferably at least $80 \times 10^{-7}/°$ C.

The reason why in the glass substrate for a CIGS solar cell of the present invention, the composition of the respective raw material components is limited as described above is as follows.

$SiO_2$: $SiO_2$ is a component to form a skeleton of glass, and if its content is less than 53 mass % (hereinafter simply referred to as "%"), the heat resistance and the chemical durability of the glass tend to be low, and the average thermal expansion coefficient may be improved. The content is preferably at least 55%, more preferably at least 57%, further preferably at least 59%.

However, if it exceeds 72%, problems may arise such that the high temperature viscosity of the glass is increased, and the melting property is deteriorated. It is preferably at most 69%, more preferably at most 65%, further preferably at most 63%.

$Al_2O_3$: $Al_2O_3$ increases the glass transition temperature, improves the weatherability (solarization), the heat resistance and the chemical durability, and increases the Young's modulus. If its content is less than 1%, the glass transition temperature tends to be low, and further the average thermal expansion coefficient may be increased. It is preferably at least 4%, more preferably at least 6%, further preferably at least 8%.

However, if it exceeds 15%, the high temperature viscosity of the glass may be increased, and the melting property may be deteriorated. Further, the devitrification temperature may be increased, and the formability may be impaired. Further, the cell efficiency may be dropped, that is, the diffusion amount of Na, which will be described later, may be decreased. It is preferably at most 14%, more preferably at most 13%, further preferably at most 12%.

$B_2O_3$ may be contained in an amount of up to 2% for the purpose of e.g. improving the melting property. If the content exceeds 2%, the glass transition temperature may be decreased, or the average thermal expansion coefficient may become small, which is not preferred for a process for forming a CIGS layer. The content is more preferably at most 1%. The content is particularly preferably at most 0.5%, and furthermore preferably, substantially no $B_2O_3$ is contained.

"Substantially no . . . is contained" means that nothing other than inevitable impurities originating from e.g. the raw materials is contained, that is, nothing is contained intentionally.

MgO: MgO is contained since it has an effect of decreasing the viscosity at the time of melting of glass to promote melting. However, its content is less than 0.5%, the high temperature viscosity of the glass may be increased, and the melting property may be deteriorated. It is preferably at least 1.5%, more preferably at least 2.5%, further preferably at least 3%.

However, if it exceeds 9%, the average thermal expansion coefficient may be increased and the devitrification temperature may be increased. It is preferably at most 8%, more preferably at most 7%, further preferably at most 6.5%.

CaO: CaO may be contained in an amount of at least 0.1% since it has an effect of decreasing the viscosity at the time of melting of glass to promote melting. The content is preferably at least 2%, more preferably at least 4%, further preferably at least 4.5%. However, if it exceeds 11%, the average thermal expansion coefficient of the glass may be increased. Further, the cell efficiency may be dropped, that is, the diffusion amount of Na, which will be described later, may be decreased. It is preferably at most 8%, more preferably at most 7.5%, further preferably at most 7%.

SrO: SrO may be contained since it has an effect of decreasing the viscosity at the time of melting of the glass to promote melting. However, if the content exceeds 11%, the cell efficiency may be dropped, that is, the diffusion amount of Na, which will be described later, may be decreased, and the average thermal expansion coefficient of the glass substrate may be increased. It is preferably at most 8%, more preferably at most 6%, further preferably at most 3%. Further, it is preferably at least 0.5%, more preferably at least 1%.

BaO: BaO may be contained since it has an effect of decrease the viscosity at the time of melting of the glass to promote melting. However, if the content exceeds 11%, the cell efficiency may be dropped, that is, the diffusion amount of Na, which will be described later, may be decreased, and the average thermal expansion coefficient of the glass substrate may be increased. Further, the specific gravity may be increased. It is preferably at most 5%, more preferably at most 3%, further preferably at most 0.5%, and particularly preferably, substantially no BaO is contained.

$ZrO_2$: $ZrO_2$ may be contained since it has effects of decreasing the viscosity at the time of melting of the glass to promote melting and increasing Tg. The content is preferably at least 0.5%. It is more preferably at least 1%, further preferably at least 1.5%, particularly preferably at least 2%. However, if the content exceeds 10.5%, the cell efficiency may be dropped, that is, the diffusion amount of Na, which will be described later, may be decreased, the devitrification temperature may be increased, and the average thermal expansion coefficient of the glass substrate may be increased. It is preferably at most 8%, more preferably at most 5%.

MgO, CaO, SrO and BaO are contained in an amount of, in total, from 4 to 25% with a view to decreasing the viscosity at the time of melting of the glass to promote melting. However, if the total amount exceeds 25%, the average thermal expansion coefficient may be increased, and the devitrification temperature may be increased. It is preferably at least 6%, more preferably at least 9%. Further, it is preferably at most 21%, more preferably at most 20%, further preferably at most 18%, particularly preferably at most 15%.

CaO, SrO and BaO are contained in an amount of at least 2% with a view to obtaining the ratio of Ca+Sr+Ba in the surface layer to that in the inner portion of the glass substrate after the $SO_2$ treatment of at most 0.35. The content is preferably at least 4%, more preferably at least 6%. If the total amount of CaO, SrO and BaO is less than 2%, a large amount of MgO will be required to be added in order to decrease the viscosity at the time of melting of the glass and increase the glass transition temperature, and the devitrification temperature may be increased. However, if it exceeds 23%, the diffusion amount of Na after heat treatment may be decreased. That is, it can be considered that since the ionic radius of Ca is close to the ionic radius of Na, Ca tends to compete with migration of Na in the glass, and it is likely to decrease the diffusion amount of Na. Further, it can be considered that since the ionic radius of Ba is large, Ba is likely to inhibit migration of Na, and it is likely to decrease the diffusion amount of Na. Sr is considered to have both the above properties of Ca and Ba. Accordingly, the content is preferably at most 19%, more preferably at most 15%, further preferably at most 10%.

SrO and BaO generates a sulfate film ($SrSO_4$, $BaSO_4$) at the time of the $SO_2$ treatment. Such a sulfate film is hardly dissolved in water as compared with another sulfate film ($MgSO_4$, $CaSO_4$, $Na_2SO_4$, $K_2SO_4$), and thus is hardly removed when it is washed. Accordingly, the total amount of SrO and BaO is preferably at most 10%, more preferably at most 8%, further preferably at most 6%, particularly preferably at most 4%.

$Na_2O$: $Na_2O$ is a component which contributes to improvement of the conversion efficiency of a CIGS solar cell, and it is an essential component. Further, it has an effect of decreasing the viscosity at the glass melting temperature to promote melting, and thus it is contained in an amount of from 2 to 11%. Na diffuses into the CIGS absorbing layer deposited over a glass to improve the cell efficiency. However, if the content is less than 2%, the diffusion amount of Na into the CIGS absorbing layer over the glass substrate may be insufficient, and the cell efficiency may be insufficient. The content is preferably at least 2.5%, more preferably at least 3%, particularly preferably at least 3.5%.

If the $Na_2O$ content exceeds 11%, the glass transition temperature may be decreased, the average thermal expansion coefficient may be improved, or the chemical durability may be deteriorated. The content is preferably at most 10%, more preferably at most 9%, further preferably at most 8%, particularly preferably less than 7%.

$K_2O$: Since $K_2O$ has the same effect as $Na_2O$, it is contained in an amount of from 2 to 21%. However, if it exceeds 21%, the cell efficiency may be dropped, that is, diffusion of Na may be inhibited, whereby the diffusion amount of Na may be decreased, and further, the glass transition temperature may be decreased, and the average thermal expansion coefficient may be improved. It is preferably at least 4%, more preferably at least 5%, further preferably at least 6%, particularly preferably at least 8%. It is preferably at most 16%, more preferably at most 12%.

$Na_2O$ and $K_2O$: The total content of $Na_2O$ and $K_2O$ is set to be from 8 to 22% in order to sufficiently decrease the viscosity at the glass melting temperature and improve the conversion efficiency of the CIGS solar cell. It is preferably at least 10%, more preferably at least 12%.

However, if it exceeds 22%, Tg tends to be too low, and the average thermal expansion coefficient tends to be too large. It is preferably at most 20%, more preferably at most 17%.

$Na_2O/(CaO+SrO+BaO)$: If $Na_2O/(CaO+SrO+BaO)$ exceeds 1.2, the precipitation reaction of $CaSO_4$, $SrSO_4$ and $BaSO_4$ becomes less likely to proceed at the time of the $SO_2$ treatment while the precipitation reaction of $Na_2SO_4$ proceeds, and as a result, Ca, Sr and Ba in the surface layer of the glass substrate become less likely to be depleted. It is preferably at most 1.0, more preferably at most 0.9, further preferably at most 0.8. The lower limit of $Na_2O/(CaO+SrO+BaO)$ is 0.1. If $Na_2O/(CaO+SrO+BaO)$ is smaller than 0.1, the $Na_2O$ amount may become too small, and the cell efficiency may be dropped. It is preferably at least 0.15, more preferably at least 2.

The glass substrate for a CIGS solar cell of the present invention essentially has a matrix composition comprising, as represented by mass % based on the following oxides, from 53 to 72% of $SiO_2$, from 1 to 15% of $Al_2O_3$, from 0.5 to 9% of MgO, from 0.1 to 11% of CaO, from 0 to 11% or SrO, from 0 to 11% or BaO, from 2 to 11% of $Na_2O$, from 2 to 21% of $K_2O$ and from 0 to 10.5% of $ZrO_2$, provided that MgO+CaO+SrO+BaO is from 4 to 25%, CaO+SrO+BaO is from 2 to 23%, $Na_2O+K_2O$ is from 8 to 22%, and $Na_2O/(CaO+SrO+BaO) \leq$ 1.2, and it is preferred that in the matrix composition, as represented by mass % based on the following oxides, CaO+

SrO+BaO is from 2 to 15%, and SrO+BaO is from 0 to 10%; $K_2O$ is from 4 to 21%, $ZrO_2$ is from 0.5 to 10.5%, and CaO+SrO+BaO is from 4 to 23%; or CaO+SrO+BaO is from 4 to 15% and SrO+BaO is from 0 to 8%.

The glass substrate for a CIGS solar cell of the present invention essentially has the above matrix composition; however, it may contain other components as long as the object of the present invention is not impaired, typically in an amount of at most 5% in total. For example, it may contain, for example, $B_2O_3$, ZnO, $Li_2O$, $WO_3$, $Nb_2O_5$, $V_2O_5$, $Bi_2O_3$, $MoO_3$ and $P_2O_5$ for the purpose of improving the weatherability, melting property, devitrification property, ultraviolet shielding property, etc.

Further, in order to improve the melting and fining properties of the glass, raw materials of $SO_3$, F, Cl and $SnO_2$ may be added to the raw material of the matrix composition so that the glass contains $SO_3$, F, Cl and $SnO_2$ in an amount of at most 2% in total.

Further, for the purpose of improving the chemical durability of the glass, the glass may contain $ZrO_2$, $Y_2O_3$, $La_2O_3$, $TiO_2$ and $SnO_2$ in an amount of at most 5% in total. Among the above components, $Y_2O_3$, $La_2O_3$ and $TiO_2$ also contribute to improvement of the Young's modulus of the glass.

Further, for the purpose of adjusting the color of the glass, the glass may contain a colorant such as $Fe_2O_3$. The content of such a colorant is preferably at most 1% in total.

Further, the glass substrate for a CIGS solar cell of the present invention preferably contains substantially no $As_2O_3$ or $Sb_2O_3$ in view of environmental burden. Further, it preferably contains substantially no ZnO in view of stable float forming. However, forming of the glass substrate for a CIGS solar cell of the present invention is not limited to the float process, and it may be produced by forming by a fusion method.

Now, the process for forming the glass substrate for a CIGS solar cell of the present invention will be described.

The glass substrate for a CIGS solar cell of the present invention may be obtained by using respective raw material components of the glass substrate so that the composition becomes as above, and by carrying out a melting/fining step and a forming step in the same manner as when a conventional glass substrate for a solar cell is produced, and then the $SO_2$ treatment which will be described later in the subsequent annealing step.

In the process for producing the glass substrate for a CIGS solar cell of the present invention, it is important to carry out the $SO_2$ treatment in the present invention in the annealing step. When the composition of the glass substrate is set to be one which is specified in the present invention, and the following $SO_2$ treatment is carried out, it is possible to obtain a glass substrate for a CIGS solar cell wherein the ratio of Ca+Sr+Ba in the surface layer to that in the inner portion of the glass substrate is at most 0.35, and the ratio of Na in the surface layer of the glass substrate after to before heat treatment is at least 1.5.

Now, the $SO_2$ treatment in the present invention will be described.

It is known that in a conventional process for producing a glass substrate, in order to prevent scratches at glass surface during conveyance of a glass in the annealing step, $SO_2$ gas is sprayed to form a protective coat of a sulfate. However, in view of prevention of yellowing at the time of providing a silver electrode for a display substrate, easiness of washing the sulfate coating, prevention of corrosion of facilities, etc., the conventional condition for spraying $SO_2$ gas is preferably such that the minimum necessary sulfate coating is provided, that is, it is preferred that the $SO_2$ treatment is carried out lightly as much as possible.

However, in the present invention, it is preferred that the $SO_2$ treatment is carried out under such a condition that the glass surface temperature is from 500 to 700° C., the $SO_2$ concentration is from 0.05 to 5 (volume) %, and the treatment time is from 1 to 10 minutes, so that the ratio of Ca+Sr+Ba in the surface layer to that in the inner portion of the glass substrate will be at most 0.35.

In the $SO_2$ treatment, the ratio of Ca+Sr+Ba in the surface layer to that in the inner portion of the glass substrate can be easily decreased as the glass surface temperature is higher, as the $SO_2$ gas concentration is higher, as the $SO_2$ treatment time is longer, and as the hermetically sealing property of the annealing furnace is higher. The $SO_2$ treatment is not necessarily carried out in an annealing furnace, and a glass after annealing may be reheated and subjected to the $SO_2$ treatment.

Since the glass substrate for a CIGS solar cell of the present invention is an alkali glass substrate containing an alkali metal oxide ($Na_2O$, $K_2O$), $SO_3$ may be effectively used as a clarifying agent, and as the forming method, a float process or a fusion method (down draw method) is suitable.

In the process for producing the glass substrate for a solar cell, as a method for forming the glass into a sheet, it is preferred to employ a float process whereby it is possible to form a glass substrate having a large area easily and stably as the solar cells become larger.

Now, a preferred embodiment of the process for producing the glass substrate for a CIGS solar cell of the present invention will be described.

First, a molten glass obtained by melting a raw material is formed into a sheet. For example, a raw material is prepared so that the glass substrate to be obtained has the above composition, and the raw material is continuously input into a melting furnace, followed by heating to about 1,450 to 1,650° C. to obtain a molten glass. Then, this molten glass is formed into a ribbon-like glass sheet by employing e.g. a float process.

Next, the ribbon-like glass sheet is drawn from the float forming furnace, and then the $SO_2$ treatment is carried out when the glass sheet is cooled to room temperature in the annealing furnace, followed by washing and removing of coating of e.g. a sulfate, and cutting to obtain a glass substrate for a CIGS solar cell.

In the process for producing a solar cell, when an electrode film of e.g. Mo or its underlayer (e.g. $SiO_2$) or the like is film-formed on the surface of the glass substrate, if the surface of the glass substrate is not clean, a film may not be formed normally. Accordingly, it is preferred to wash the glass substrate.

The method for washing is not particularly limited; however, washing with water, washing with a detergent or washing by brushing with e.g. a brush while a slurry containing cerium oxide is scattered may be mentioned. In the case of washing with a slurry containing cerium oxide, it is preferred that the glass substrate is then washed with e.g. an acidic detergent such as hydrochloric acid or sulfuric acid.

It is preferred that there is no irregularity at the surface of the glass substrate due to contaminant or attached foreign substance such as the above cerium oxide. If there is irregularity, when the electrode film, its underlayer or the like is film-formed, irregularity at the film surface, deviation of the film thickness, a pin hole of the film, etc. may arise, and the cell efficiency may be dropped. The difference in height of the irregularity is preferably at most 20 nm.

The amount (atom %) of Na in the surface layer of the glass substrate is preferably uniform in the entire region of the glass substrate for a CIGS solar cell. If the amount of Na in the surface layer of the glass substrate is not uniform, a part of the glass substrate has a low cell efficiency, and affected by that portion, the conversion efficiency of the solar cell may be decreased.

The glass substrate for a CIGS solar cell of the present invention is suitable as a glass substrate for a CIGS solar cell and also as a cover glass.

In the case where the glass substrate for a CIGS solar cell of the present invention is employed as a glass substrate, the thickness of the glass substrate is preferably set to be at most 3 mm, more preferably at most 2 mm. Further, the method to provide a CIGS absorbing layer to the glass substrate is not particularly limited. When the glass substrate for a CIGS solar cell of the present invention is used, the heating temperature at the time of forming a photoelectric conversion layer may be set to be from 500 to 650° C.

In the case where the glass substrate for a CIGS solar cell of the present invention is used only as the glass substrate, the cover glass, etc. are not limited. Another example of the composition of the cover glass may be soda-lime glass.

In the case where the glass substrate for a CIGS solar cell of the present invention is used as a cover glass, the thickness of the cover glass is preferably set to be at most 3 mm, more preferably at most 2 mm. Further, the method to assemble a cover glass into a glass substrate having a photoelectric conversion layer is not particularly limited. When the glass substrate for a CIGS solar cell of the present invention is used, in a case of assembling by heating, the heating temperature may be set to be from 500 to 650° C.

It is preferred to use the glass substrates for a CIGS solar cell of the present invention as a glass substrate for a CIGS solar cell and also as a cover glass, because their average thermal expansion coefficients are equivalent, and thus e.g. heat deformation will not occur at the time of assembling a solar cell.

Next, the solar cell of the present invention will be described.

The solar cell of the present invention comprises a glass substrate, a cover glass and a vapor-deposited Cu—In—Ga—Se absorbing layer disposed between the glass substrate and the cover glass, wherein between the glass substrate and the cover glass, at least the glass substrate is the glass substrate for a vapor-deposited Cu—In—Ga—Se film solar cell of the present invention.

Hereinafter, the solar cell of the present invention will be described in detail with reference to the drawings.

The present invention is not limited to the accompanying drawings.

FIG. 1 is a cross-sectional view schematically illustrating an example of the solar cell of the present invention.

In FIG. 1, the solar cell (CIGS solar cell) 1 of the present invention comprises a glass substrate 5, a cover glass 19 and a CIGS layer 9 between the glass substrate 5 and the cover glass 19. The glass substrate 5 is preferably composed of the above-described glass substrate for a CIGS solar cell of the present invention. The solar cell 1 has a rear electrode layer of a Mo film as a positive electrode 7 on the glass substrate 5, and has a photoelectric conversion layer as a CIGS layer 9 thereon. The composition of the CIGS layer may, for example, be $Cu(In_{1-x}Ga_x)Se_2$. x represents the compositional ratio of In and Ga, and x satisfies $0<x<1$.

The solar cell has a transparent conductive film 13 of ZnO or ITO via a film of CdS (cadmium sulfide) or ZnS (zinc sulfide) as a buffer layer 11 on the CIGS layer 9, and further has a lead-out electrode such as an Al electrode (aluminum electrode) as a negative electrode 15 thereon. An antireflection film may be provided at a position between these layers where it is required. In FIG. 1, an antireflection film 17 is provided between the transparent conductive film 13 and the negative electrode 15.

Further, the cover glass 19 may be provided on the negative electrode 15, and as necessary, the negative electrode and the cover glass are sealed with a resin or bonded with a transparent resin for bonding. As the cover glass, the glass substrate for a CIGS solar cell of the present invention may be used.

In the present invention, the edge portion of the photoelectric conversion layer or the edge portion of the solar cell may be sealed. The material for sealing may, for example, be the same material as the glass substrate for a CIGS solar cell of the present invention, another glass or a resin.

The thicknesses of the respective layers of the solar cell shown in the accompanying drawing are not limited by the drawing.

EXAMPLES

Now, the present invention will be described in further detail. However, the present invention is by no means limited to these Examples or Preparation Examples.

Working Examples (Examples 1, 2 and 7 to 30) and Comparative Examples (Examples 3 to 6 and 31 to 46) of the glass substrate for a CIGS solar cell of the present invention will be described.

Raw materials of the respective components were prepared so that the composition would be as shown in the Tables 1 to 5, and, based on $SO_3$, 0.4 part by mass of a sulfate per 100 parts by mass of this glass was added to the starting materials followed by heating at a temperature of 1,600° C. for 3 hours by means of a platinum crucible to melt them. When melting is carried out, a platinum stirrer was put therein, followed by stirring for 1 hour to homogenize the glass. Next, the molten glass was poured out and shaped into a sheet, followed by cooling. Then, the glass was subjected to a grinding process to have a size of 30×30×1.1 mm, and the both surfaces each having a size of 30×30 were subjected to mirror finishing, followed by washing.

Then, as a simulation of the drawing from a float forming furnace and annealing in an annealing furnace, each of the glass substrates of Examples 1 to 3 and 7 to 34 was subjected to a $SO_2$ treatment in an electric furnace under any one of the following $SO_2$ treatment conditions, and it was taken out from the electric furnace, followed by cooling to room temperature. The glass substrates of Examples 4 to 6 and 35 to 46 were not subjected to a $SO_2$ treatment.

($SO_2$ Treatment Condition A)
   Temperature: 600° C.
   $SO_2$ concentration: 2.5 vol %
   Treatment time: 5 minutes ($SO_2$ Treatment Condition B)
   Temperature: 580° C.
   $SO_2$ concentration: 2.5 vol %
   Treatment time: 5 minutes ($SO_2$ Treatment Condition C)
   Temperature: 600° C.
   $SO_2$ concentration: 0.2 vol %
   Treatment time: 10 minutes ($SO_2$ Treatment Condition D)
   Temperature: 650° C.
   $SO_2$ concentration: 0.5 vol %
   Treatment time: 5 minutes (SO$_2$ Treatment Condition E)
  Temperature: 550° C.
  SO$_2$ concentration: 2.5 vol %
  Treatment time: 5 minutes
(SO$_2$ Treatment Condition F)
  Temperature: 600° C.
  SO$_2$ concentration: 0.5 vol %
  Treatment time: 5 minutes
(SO$_2$ Treatment Condition G)
  Temperature: 600° C.
  SO$_2$ concentration: 0.2 vol %
  Treatment time: 5 minutes
(SO$_2$ Treatment Condition H)
  Temperature: 600° C.
  SO$_2$ concentration: 2.5 vol %
  Treatment time: 10 minutes
(SO$_2$ Treatment Condition I)
  Temperature: 600° C.
  SO$_2$ concentration: 2.5 vol %
  Treatment time: 5 minutes With respect to such obtained glass substrate, the average thermal expansion coefficient (unit: ×10$^{-7}$/° C.), the glass transition temperature (Tg) (unit: ° C.), the ratio of Ca+Sr+Ba in the surface layer to that in the inner portion of the glass substrate and the ratio of Na in the surface layer of the glass substrate after to before heat treatment were measured, and the results are shown in Tables 1 to 5. The measuring methods of respective properties are as follows.

(1) Tg: Tg was measured by using TMA, and it was obtained in accordance with JIS R3103-3 (2001).

(2) Average thermal expansion coefficient at 50 to 350° C.: It was measured by using a differential thermal dilatometer (TMA), and it was obtained in accordance with JIS R3102 (1995).

(3) Ratio of Ca+Sr+Ba in surface layer to that in the inner portion of glass substrate: The amounts (atom %) of Ca, Sr and Ba at 10, 20, 30, 40 and 5,000 nm in depth from the surface of the glass substrate were measured by using a X-ray photoelectron spectrometer (ESCA5500, manufactured by ULVAC-PHI, Inc.). To grind the glass substrate from the surface to 10 to 40 nm, sputter etching was carried out by using a C$_{60}$ ion beam, and to grind the glass substrate from the surface to 5,000 nm, the glass substrate was ground to 4,000 nm with a water slurry of cerium oxide, followed by sputter etching by using a C$_{60}$ ion beam.

The ratio of the average of the total amounts (atom %) of Ca, Sr and Ba at 10, 20, 30 and 40 nm in depth from the surface of the glass substrate to the total amount (atom %) of Ca, Sr and Ba at 5,000 nm in depth from the surface of the glass substrate was obtained.

(4) Ratio of Na in the surface layer of the glass substrate after to before heat treatment: The Na amounts (atom %) at 10, 20, 30 and 40 nm in depth from the surface of the glass substrate were measured by using a X-ray photoelectron spectrometer (ESCA5500, manufactured by ULVAC-PHI, Inc.). To grind the glass substrate from the surface to 10 to 40 nm, sputter etching was carried out by using a C$_{60}$ ion beam.

Then, the glass substrate was kept in an electric furnace, and the temperature was raised at a rate of 10° C. per minute to 600° C. in a N$_2$ atmosphere (simulating an oxygen-free condition), the temperature was maintained at 600° C. for 60 minutes, and then the temperature was decreased at a rate of 2° C. to anneal the glass substrate to room temperature.

Then, the Na amounts (atom %) at 10, 20, 30 and 40 nm in depth from the surface of the glass substrate were measured by the above method.

The ratio of the average Na amount (atom %) within from 10 to 40 nm in depth from the surface of the glass substrate after a heat treatment at 600° C. under a N$_2$ atmosphere for 1 hour to such average Na amount before the heat treatment was obtained.

(5) Cell efficiency: By using each of the above-obtained glass substrates for a solar cell of Examples 1 to 46, a CIGS solar cell sample was prepared by the process described below, and the cell efficiency was measured by the method described below.

(6) Diffusion amount of Na into CIGS absorbing layer: Na concentration in the CIGS absorbing layer of the CIGS solar cell prepared by the following method was determined by secondary ion mass spectrometry (SIMS).

[Process for Preparing Sample of CIGS Solar Cell]

On a glass substrate, a molybdenum film was film-formed by sputtering. The molybdenum film was film-formed under a film forming condition such that the substrate temperature was room temperature, and the film thickness was from 500 to 1,000 nm.

Then, by means of a multi-source vapor deposition apparatus, the glass substrate provided with a molybdenum film was heated at 200° C. for 30 minutes, and a CIGS layer was film-formed by a three-stage method. The film forming condition was such that the substrate temperature was from 400 to 600° C., and the film thickness was at least 1.8 μm.

The film forming of the CIGS layer by a three-stage method was carried out specifically by the following process. In the first stage, the substrate temperature was heated to about 400° C., and In, Ga and Se were simultaneously vapor deposited. Next, in the second stage, the substrate temperature was raised to 500 to 600° C., and Cu and Se were simultaneously vapor deposited until the composition of the whole film became Cu-rich. Then, in the third stage, In, Ga and Se were again simultaneously vapor deposited so that a CIGS layer having a composition of In and Ga-rich (ratio Cu/(In+Ga)<1) and having a thickness of at least 1.8 μm was finally obtained.

Then, the glass substrate having the CIGS layer formed was immersed in a potassium cyanide solution having a concentration of 10% for 60 seconds to be washed, and the CuSe layer, which may cause leakage current, was removed.

On the CIGS layer, a CdS layer was film-formed by CBD (chemical bath deposition). The CdS layer was film-formed by using 0.015M cadmium sulfate, 1.5M thiourea and 15M ammonia aqueous solution so that the thickness became from 50 to 100 nm.

On the CdS layer, a ZnO layer and a AZO layer were film-formed by sputtering by using a ZnO target and a AZO target (a ZnO target containing 1.5 wt % of Al$_2$O$_3$). A ZnO film having a thickness of about 100 nm and an AZO film having a thickness of about 200 nm were film-formed.

Further, on the AZO layer, an aluminum electrode was film-formed by heat vapor deposition.

Then, remaining the molybdenum film, the CIGS layer and the upper layers were ground by using a sharp-edged metal board to form cells and prepare a bottom electrode, thereby to prepare a CIGS solar cell sample having 4 cells each having a constant effective area (area excluding aluminum electrode: about 0.5 cm$^2$) on each side, i.e. 8 cells in total in rows.

[Measurement of Conversion Efficiency of CIGS Solar Cell Sample]

A container which is about 30 cm on a side and which is capable of blocking external light penetrating inside was prepared. The inside of the container was painted black in order to suppress reflection of light in the container, and the CIGS solar cell was installed in the container.

The molybdenum film which was coated with an InGa solvent in advance (for ohmic contact) and the aluminum upper lead-out electrode at the surface of 8 cells were connected to a voltage/current generator via the positive terminal and the negative terminal, respectively. The temperature in the container was controlled to be 25° C. by a temperature controller. While external light was blocked, in the container, the solar cell was irradiated with a xenon lamp from above for 10 seconds, followed by retention for 60 seconds to stabilize the temperature of the solar cell. Then, the current values at voltages of −1 V to +1 V were measured while the voltage was increased by 0.015 V for each measurement both when the solar cell was not irradiated with a xenon lamp and when the solar cell was irradiated with a xenon lamp. The cell efficiency was calculated from thus obtained current-voltage characteristics at the time of irradiation.

The cell efficiency was obtained by the following formula (1), from the open-circuit voltage (Voc), short-circuit current density (Jsc) and fill factor (FF). Average of the power generation efficiencies of the 8 cells are shown in the following Tables.

$$\text{Cell efficiency [\%]} = Voc\,[V] \times Jsc\,[A/cm^2] \times FF\,[\text{dimensionless}] \times 100 / \text{irradiance of light source used for test}\,[W/cm^2] \quad (1)$$

In the formula, the open-circuit voltage (Voc) is the output when the terminal is opened, the short-circuit current density (Jsc) is obtained by dividing the short-circuit current (Isc) which is a current when the terminal is short-circuited by the effective area, and the fill factor (FF) is obtained by dividing the product of the voltage at the maximum output point (maximum voltage value (Vmax)) where the maximum output is obtained, and the current at the maximum output point (maximum current value (Imax)) by the product of the open-circuit voltage (Voc) and the short-circuit current (Isc).

The amount of $SO_3$ remained in the glass was from 100 to 500 ppm.

TABLE 1

| wt % | Ex. 1 | Ex. 2 | Ex. 3 | Ex. 4 | Ex. 5 | Ex. 6 |
|---|---|---|---|---|---|---|
| $SiO_2$ | 60.6 | 57.0 | 72.9 | 60.6 | 57.0 | 72.9 |
| $Al_2O_3$ | 9.5 | 7.0 | 1.9 | 9.5 | 7.0 | 1.9 |
| MgO | 5.0 | 2.0 | 3.7 | 5.0 | 2.0 | 3.7 |
| CaO | 6.1 | 2.0 | 8.1 | 6.1 | 2.0 | 8.1 |
| SrO | 1.6 | 9.0 | 0 | 1.6 | 9.0 | 0 |
| BaO | 0.1 | 8.0 | 0 | 0.1 | 8.0 | 0 |
| $ZrO_2$ | 2.5 | 5.0 | 0 | 2.5 | 5.0 | 0 |
| $Na_2O$ | 5.0 | 4.0 | 13.1 | 5.0 | 4.0 | 13.1 |
| $K_2O$ | 9.6 | 6.0 | 0.3 | 9.6 | 6.0 | 0.3 |
| MgO + CaO + SrO + BaO | 12.8 | 21.0 | 11.8 | 12.8 | 21.0 | 11.8 |
| CaO + SrO + BaO | 7.8 | 19.0 | 8.1 | 7.8 | 19.0 | 8.1 |
| SrO + BaO | 1.7 | 17.0 | 0 | 1.7 | 17.0 | 0 |
| $Na_2O + K_2O$ | 14.6 | 10.0 | 13.4 | 14.6 | 10.0 | 13.4 |
| $Na_2O/(CaO + SrO + BaO)$ | 0.64 | 0.21 | 1.62 | 0.64 | 0.21 | 1.62 |
| Average thermal expansion coefficient $\times 10^7/°C.$ | 84 | 83 | 85 | 84 | 83 | 85 |
| Tg (° C.) | 633 | 627 | 550 | 633 | 627 | 550 |
| Amount A (atom %) of Ca + Sr + Ba in surface layer of glass substrate | <0.05 | <0.05 | 0.90 | 3.22 | 5.99 | 3.80 |
| Amount B (atom %) of Ca + Sr + Ba in inner portion of glass substrate | 3.3 | 6.1 | 3.9 | 3.3 | 6.1 | 3.9 |
| Ratio (A/B) of Ca + Sr + Ba in surface layer to that in inner portion of glass substrate | Less than 0.02 | Less than 0.01 | 0.23 | 0.98 | 0.98 | 0.97 |
| Na (before heat treatment) amount C (atom %) in surface layer of glass substrate | 1.1 | 0.9 | 5.7 | 3.3 | 2.8 | 8.3 |
| Na (after heat treatment) amount D (atom %) in surface layer of glass substrate | 2.8 | 2.2 | 5.6 | 3.0 | 2.6 | 5.6 |
| Ratio D/C of Na in surface layer of glass substrate after to before heat treatment | 2.55 | 2.44 | 0.98 | 0.91 | 0.93 | 0.67 |
| $SO_2$ treatment condition | A | H | A | — | — | — |
| Cell efficiency (%) | (13.8) | (13.7) | (12.4) | 13.4 | 13.5 | 12.4 |
| Diffusion amount of Na in CIGS absorbing layer ($10^{17}$ atoms/cm³) | (4.3) | (4.2) | (1.7) | 3.9 | 3.9 | 1.7 |

TABLE 2

| wt % | Ex. 7 | Ex. 8 | Ex. 9 | Ex. 10 | Ex. 11 | Ex. 12 | Ex. 13 |
|---|---|---|---|---|---|---|---|
| $SiO_2$ | 60.6 | 60.6 | 60.6 | 60.6 | 61.9 | 61.9 | 61.9 |
| $Al_2O_3$ | 9.5 | 9.5 | 9.5 | 9.5 | 9.6 | 9.6 | 9.6 |

TABLE 2-continued

| wt % | Ex. 7 | Ex. 8 | Ex. 9 | Ex. 10 | Ex. 11 | Ex. 12 | Ex. 13 |
|---|---|---|---|---|---|---|---|
| MgO | 5.0 | 5.0 | 5.0 | 5.0 | 7.0 | 7.0 | 7.0 |
| CaO | 6.1 | 6.1 | 6.1 | 6.1 | 4.4 | 4.4 | 4.4 |
| SrO | 1.6 | 1.6 | 1.6 | 1.6 | 0.8 | 0.8 | 0.8 |
| BaO | 0.1 | 0.1 | 0.1 | 0.1 | 0.6 | 0.6 | 0.6 |
| $ZrO_2$ | 2.5 | 2.5 | 2.5 | 2.5 | 3.4 | 3.4 | 3.4 |
| $Na_2O$ | 5.0 | 5.0 | 5.0 | 5.0 | 4.9 | 4.9 | 4.9 |
| $K_2O$ | 9.6 | 9.6 | 9.6 | 9.6 | 7.4 | 7.4 | 7.4 |
| MgO + CaO + SrO + BaO | 12.8 | 12.8 | 12.8 | 12.8 | 12.8 | 12.8 | 12.8 |
| CaO + SrO + BaO | 7.8 | 7.8 | 7.8 | 7.8 | 5.8 | 5.8 | 5.8 |
| SrO + BaO | 1.7 | 1.7 | 1.7 | 1.7 | 1.4 | 1.4 | 1.4 |
| $Na_2O$ + $K_2O$ | 14.6 | 14.6 | 14.6 | 14.6 | 12.3 | 12.3 | 12.3 |
| $Na_2O$/(CaO + SrO + BaO) | 0.64 | 0.64 | 0.64 | 0.64 | 0.84 | 0.84 | 0.84 |
| Average thermal expansion co-efficient $\times 10^7$/° C. | 84 | 84 | 84 | 84 | 76 | 76 | 76 |
| Tg (° C.) | 633 | 633 | 633 | 633 | 657 | 657 | 657 |
| Amount A (atom %) of Ca + Sr + Ba in surface layer of glass substrate | 0.10 | 0.95 | 0.38 | 0.38 | <0.05 | <0.05 | <0.05 |
| Amount B (atom %) of Ca + Sr + Ba in inner portion of glass substrate | 3.3 | 3.3 | 3.3 | 3.3 | 2.1 | 2.1 | 2.1 |
| Ratio (A/B) of Ca + Sr + Ba in surface layer to that in inner portion of glass substrate | 0.03 | 0.29 | 0.12 | 0.12 | Less than 0.02 | Less than 0.02 | Less than 0.02 |
| Na (before heat treatment) amount C (atom %) in surface layer of glass substrate | 0.9 | 1.3 | 1.0 | 0.9 | 1.0 | 1.1 | 1.0 |
| Na (after heat treatment) amount D (atom %) in surface layer of glass substrate | 2.8 | 2.9 | 2.9 | 2.9 | 2.7 | 2.7 | 2.7 |
| Ratio D/C of Na in surface layer of glass substrate after to before heat treatment | 3.11 | 2.23 | 2.90 | 3.22 | 2.70 | 2.45 | 2.70 |
| $SO_2$ treatment condition | B | C | D | E | E | A | B |
| Cell efficiency (%) | 13.7 | 13.9 | 13.9 | 14.8 | (13.9) | (13.8) | 13.9 |
| Diffusion amount of Na in CIGS absorbing layer ($10^{17}$ atoms/cm$^3$) | 4.5 | (4.5) | 4.6 | 5.9 | (4.5) | (4.3) | 4.5 |

TABLE 3

| wt % | Ex. 14 | Ex. 15 | Ex. 16 | Ex. 17 | Ex. 18 | Ex. 19 | Ex. 20 |
|---|---|---|---|---|---|---|---|
| $SiO_2$ | 62.1 | 62.1 | 62.1 | 65.6 | 65.6 | 65.6 | 65.6 |
| $Al_2O_3$ | 8.7 | 8.7 | 8.7 | 5.7 | 5.7 | 5.7 | 5.7 |
| MgO | 6.6 | 6.6 | 6.6 | 7.7 | 7.7 | 7.7 | 7.7 |
| CaO | 4.8 | 4.8 | 4.8 | 3.1 | 3.1 | 3.1 | 3.1 |
| SrO | 1.2 | 1.2 | 1.2 | 0 | 0 | 0 | 0 |
| BaO | 2.4 | 2.4 | 2.4 | 0 | 0 | 0 | 0 |
| $ZrO_2$ | 2.9 | 2.9 | 2.9 | 3.9 | 3.9 | 3.9 | 3.9 |
| $Na_2O$ | 3.9 | 3.9 | 3.9 | 3.5 | 3.5 | 3.5 | 3.5 |
| $K_2O$ | 7.4 | 7.4 | 7.4 | 10.5 | 10.5 | 10.5 | 10.5 |
| MgO + CaO + SrO + BaO | 15.0 | 15.0 | 15.0 | 10.8 | 10.8 | 10.8 | 10.8 |
| CaO + SrO + BaO | 8.4 | 8.4 | 8.4 | 3.1 | 3.1 | 3.1 | 3.1 |
| SrO + BaO | 3.6 | 3.6 | 3.6 | 0 | 0 | 0 | 0 |
| $Na_2O$ + $K_2O$ | 11.2 | 11.2 | 11.2 | 14.0 | 14.0 | 14.0 | 14.0 |
| $Na_2O$/(CaO + SrO + BaO) | 0.46 | 0.46 | 0.46 | 1.11 | 1.11 | 1.11 | 1.11 |
| Average thermal expansion co-efficient $\times 10^7$/° C. | 75 | 75 | 75 | 76 | 76 | 76 | 76 |
| Tg (° C.) | 655 | 655 | 655 | 658 | 658 | 658 | 658 |
| Amount A (atom %) of Ca + Sr + Ba in surface layer of glass substrate | 0.05 | <0.05 | 0.13 | <0.05 | <0.05 | <0.05 | <0.05 |
| Amount B (atom %) of Ca + Sr + Ba in inner portion of glass substrate | 3.0 | 3.0 | 3.0 | 0.8 | 0.8 | 0.8 | 0.8 |

TABLE 3-continued

|  | | | | | | |  |
|---|---|---|---|---|---|---|---|
| Ratio (A/B) of Ca + Sr + Ba in surface layer to that in inner portion of glass substrate | 0.02 | Less than 0.02 | 0.04 | Less than 0.06 | Less than 0.06 | Less than 0.06 | Less than 0.06 |
| Na (before heat treatment) amount C (atom %) in surface layer of glass substrate | 0.8 | 0.9 | 0.9 | 0.7 | 0.8 | 0.6 | 0.9 |
| Na (after heat treatment) amount D (atom %) in surface layer of glass substrate | 2.2 | 2.2 | 2.2 | 1.9 | 1.9 | 1.9 | 2.0 |
| Ratio D/C of Na in surface layer of glass substrate after to before heat treatment | 2.75 | 2.44 | 2.44 | 2.71 | 2.38 | 3.17 | 2.22 |
| $SO_2$ treatment condition | E | A | F | E | A | B | F |
| Cell efficiency (%) | (13.9) | 13.7 | (13.7) | (13.9) | (13.7) | 14.1 | (13.6) |
| Diffusion amount of Na in CIGS absorbing layer ($10^{17}$ atoms/cm$^3$) | (4.5) | 4.2 | (4.2) | (4.5) | (4.2) | 4.9 | (4.0) |

| wt % | Ex. 21 | Ex. 22 | Ex. 23 | Ex. 24 | Ex. 25 |
|---|---|---|---|---|---|
| $SiO_2$ | 62.7 | 62.7 | 57.6 | 57.6 | 62.0 |
| $Al_2O_3$ | 7.9 | 7.9 | 10.5 | 10.5 | 11.0 |
| MgO | 0.6 | 0.6 | 3.5 | 3.5 | 8.5 |
| CaO | 10.4 | 10.4 | 5.0 | 5.0 | 9.5 |
| SrO | 1.6 | 1.6 | 6.5 | 6.5 | 0 |
| BaO | 0 | 0 | 1.9 | 1.9 | 0 |
| $ZrO_2$ | 2.9 | 2.9 | 5.5 | 5.5 | 0 |
| $Na_2O$ | 5.5 | 5.5 | 6.0 | 6.0 | 6.0 |
| $K_2O$ | 8.4 | 8.4 | 3.5 | 3.5 | 3.0 |
| MgO + CaO + SrO + BaO | 12.6 | 12.6 | 16.9 | 16.9 | 18.0 |
| CaO + SrO + BaO | 12.0 | 12.0 | 13.4 | 13.4 | 9.5 |
| SrO + BaO | 1.6 | 1.6 | 8.4 | 8.4 | 0 |
| $Na_2O + K_2O$ | 13.9 | 13.9 | 9.5 | 9.5 | 9.0 |
| $Na_2O/(CaO + SrO + BaO)$ | 0.46 | 0.46 | 0.45 | 0.45 | 0.63 |
| Average thermal expansion co-efficient $\times 10^7/°C.$ | 84 | 84 | 74 | 74 | 74 |
| Tg (°C.) | 631 | 631 | 672 | 672 | 672 |
| Amount A (atom %) of Ca + Sr + Ba in surface layer of glass substrate | 0.58 | 1.12 | <0.05 | 0.30 | <0.05 |
| Amount B (atom %) of Ca + Sr + Ba in inner portion of glass substrate | 6.3 | 6.3 | 7.9 | 7.9 | 4.7 |
| Ratio (A/B) of Ca + Sr + Ba in surface layer to that in inner portion of glass substrate | 0.09 | 0.18 | Less than 0.01 | 0.04 | Less than 0.01 |
| Na (before heat treatment) amount C (atom %) in surface layer of glass substrate | 1.1 | 1.3 | 1.3 | 1.6 | 1.4 |
| Na (after heat treatment) amount D (atom %) in surface layer of glass substrate | 2.8 | 2.8 | 3.5 | 3.6 | 3.4 |
| Ratio D/C of Na in surface layer of glass substrate after to before heat treatment | 2.55 | 2.15 | 2.69 | 2.25 | 2.43 |
| $SO_2$ treatment condition | E | F | A | E | A |
| Cell efficiency (%) | (13.8) | (13.6) | (13.9) | (13.6) | (13.7) |
| Diffusion amount of Na in CIGS absorbing layer ($10^{17}$ atoms/cm$^3$) | (4.3) | (4.0) | (4.5) | (4.0) | (4.2) |

TABLE 4

| wt % | Ex. 26 | Ex. 27 | Ex. 28 | Ex. 29 | Ex. 30 |
|---|---|---|---|---|---|
| $SiO_2$ | 62.5 | 63.0 | 63.0 | 64.5 | 57.5 |
| $Al_2O_3$ | 8.0 | 8.5 | 9.5 | 6.0 | 9.5 |
| MgO | 5.5 | 3.5 | 7.0 | 6.5 | 8.5 |

TABLE 4-continued

| | | | | | |
|---|---|---|---|---|---|
| CaO | 6.0 | 6.0 | 5.0 | 2.5 | 5.5 |
| SrO | 2.0 | 2.0 | 1.0 | 1.5 | 0.5 |
| BaO | 0.0 | 2.0 | 0.0 | 1.0 | 0.0 |
| $ZrO_2$ | 2.0 | 2.5 | 2.0 | 3.5 | 3.5 |
| $Na_2O$ | 6.0 | 5.0 | 3.0 | 5.0 | 6.0 |
| $K_2O$ | 8.0 | 7.5 | 9.5 | 9.5 | 9.0 |
| MgO + CaO + SrO + BaO | 13.5 | 13.5 | 13.0 | 11.5 | 14.5 |
| CaO + SrO + BaO | 8.0 | 10.0 | 6.0 | 5.0 | 6.0 |
| SrO + BaO | 2.0 | 4.0 | 1.0 | 2.5 | 0.5 |
| $Na_2O + K_2O$ | 14.0 | 12.5 | 12.5 | 14.5 | 15.0 |
| $Na_2O$/(CaO + SrO + BaO) | 0.75 | 0.50 | 0.50 | 1.00 | 1.00 |
| Average thermal expansion coefficient ×$10^7$/° C. | 85 | 80 | 76 | 82 | 86 |
| Tg (° C.) | 626 | 640 | 676 | 630 | 646 |
| Amount A (atom %) of Ca + Sr + Ba in surface layer of glass substrate | 0.07 | <0.05 | <0.05 | <0.05 | <0.05 |
| Amount B (atom %) of Ca + Sr + Ba in inner portion of glass substrate | 3.4 | 4.0 | 2.4 | 1.2 | 2.6 |
| Ratio (A/B) of Ca + Sr + Ba in surface layer to that in inner portion of glass substrate | 0.02 | Less than 0.01 | Less than 0.02 | Less than 0.04 | Less than 0.02 |
| Na (before heat treatment) amount C (atom %) in surface layer of glass substrate | 1.3 | 1.0 | 0.65 | 1.0 | 1.2 |
| Na (after heat treatment) amount D (atom %) in surface layer of glass substrate | 3.3 | 2.8 | 1.6 | 2.8 | 3.4 |
| Ratio D/C of Na in surface layer of glass substrate after to before heat treatment | 2.54 | 2.80 | 2.46 | 2.80 | 2.83 |
| $SO_2$ treatment condition | I | I | I | I | I |
| Cell efficiency (%) | (13.8) | (13.9) | (13.8) | (13.9) | (14.0) |
| Diffusion amount of Na in CIGS absorbing layer ($10^{17}$ atoms/cm$^3$) | (4.4) | (4.6) | (4.3) | (4.6) | (4.7) |

| wt % | Ex. 31 | Ex. 32 | Ex. 33 | Ex. 34 |
|---|---|---|---|---|
| $SiO_2$ | 72.9 | 72.9 | 64.6 | 64.6 |
| $Al_2O_3$ | 1.9 | 1.9 | 2.4 | 2.4 |
| MgO | 3.7 | 3.7 | 3.7 | 3.7 |
| CaO | 8.1 | 8.1 | 6.0 | 6.0 |
| SrO | 0 | 0 | 0 | 0 |
| BaO | 0 | 0 | 0 | 0 |
| $ZrO_2$ | 0 | 0 | 4.7 | 4.7 |
| $Na_2O$ | 13.1 | 13.1 | 0.5 | 0.5 |
| $K_2O$ | 0.3 | 0.3 | 18.1 | 18.1 |
| MgO + CaO + SrO + BaO | 11.8 | 11.8 | 9.7 | 9.7 |
| CaO + SrO + BaO | 8.1 | 8.1 | 6.0 | 6.0 |
| SrO + BaO | 0 | 0 | 0 | 0 |
| $Na_2O + K_2O$ | 13.4 | 13.4 | 18.6 | 18.6 |
| $Na_2O$/(CaO + SrO + BaO) | 1.62 | 1.62 | 0.08 | 0.08 |
| Average thermal expansion coefficient ×$10^7$/° C. | 85 | 85 | 83 | 83 |
| Tg (° C.) | 550 | 550 | 662 | 662 |
| Amount A (atom %) of Ca + Sr + Ba in surface layer of glass substrate | 1.32 | 1.83 | <0.05 | 0.06 |
| Amount B (atom %) of Ca + Sr + Ba in inner portion of glass substrate | 3.7 | 3.9 | 2.8 | 2.8 |
| Ratio (A/B) of Ca + Sr + Ba in surface layer to that in inner portion of glass substrate | 0.36 | 0.47 | Less than 0.02 | 0.02 |
| Na (before heat treatment) amount C (atom %) in surface layer of glass substrate | 5.5 | 6.1 | 0.12 | 0.12 |
| Na (after heat treatment) amount D (atom %) in surface layer of glass substrate | 6.3 | 5.6 | 0.23 | 0.23 |

TABLE 4-continued

| | | | | |
|---|---|---|---|---|
| Ratio D/C of Na in surface layer of glass substrate after to before heat treatment | 1.15 | 0.92 | 1.92 | 1.92 |
| $SO_2$ treatment condition | E | I | E | G |
| Cell efficiency (%) | (12.7) | 12.6 | (13.4) | (13.4) |
| Diffusion amount of Na in CIGS absorbing layer ($10^{17}$ atoms/cm$^3$) | (2.3) | 2.1 | (3.6) | (3.6) |

TABLE 5

| wt % | Ex. 35 | Ex. 36 | Ex. 37 | Ex. 38 | Ex. 39 | Ex. 40 | Ex. 41 |
|---|---|---|---|---|---|---|---|
| $SiO_2$ | 61.9 | 62.1 | 65.6 | 62.7 | 57.6 | 62.0 | 64.6 |
| $Al_2O_3$ | 9.6 | 8.7 | 5.7 | 7.9 | 10.5 | 11.0 | 2.4 |
| MgO | 7.0 | 6.6 | 7.7 | 0.6 | 3.5 | 8.5 | 3.7 |
| CaO | 4.4 | 4.8 | 3.1 | 10.4 | 5.0 | 9.5 | 6.0 |
| SrO | 0.8 | 1.2 | 0 | 1.6 | 6.5 | 0 | 0 |
| BaO | 0.6 | 2.4 | 0 | 0 | 1.9 | 0 | 0 |
| $ZrO_2$ | 3.4 | 2.9 | 3.9 | 2.9 | 5.5 | 0 | 4.7 |
| $Na_2O$ | 4.9 | 3.9 | 3.5 | 5.5 | 6.0 | 6.0 | 0.5 |
| $K_2O$ | 7.4 | 7.4 | 10.5 | 8.4 | 3.5 | 3.0 | 18.1 |
| MgO + CaO + SrO + BaO | 12.8 | 15.0 | 10.8 | 12.6 | 16.9 | 18.0 | 9.7 |
| CaO + SrO + BaO | 5.8 | 8.4 | 3.1 | 12.0 | 13.4 | 9.5 | 6.0 |
| SrO + BaO | 1.4 | 3.6 | 0 | 1.6 | 8.4 | 0 | 0 |
| $Na_2O + K_2O$ | 12.3 | 11.2 | 14.0 | 13.9 | 9.5 | 9.0 | 18.6 |
| $Na_2O/(CaO + SrO + BaO)$ | 0.84 | 0.46 | 1.11 | 0.46 | 0.45 | 0.63 | 0.08 |
| Average thermal expansion coefficient ×$10^{7}$/° C. | 76 | 75 | 76 | 84 | 74 | 74 | 83 |
| Tg (° C.) | 657 | 655 | 658 | 631 | 672 | 672 | 662 |
| Amount A (atom %) of Ca + Sr + Ba in surface layer of glass substrate | 2.01 | 2.82 | 0.80 | 5.94 | 7.09 | 4.51 | 2.63 |
| Amount B (atom %) of Ca + Sr + Ba in inner portion of glass substrate | 2.1 | 3.0 | 0.8 | 6.3 | 7.9 | 4.7 | 2.8 |
| Ratio (A/B) of Ca + Sr + Ba in surface layer to that in inner portion of glass substrate | 0.96 | 0.94 | 1.00 | 0.94 | 0.90 | 0.96 | 0.94 |
| Na (before heat treatment) amount C (atom %) in surface layer of glass substrate | 3.1 | 2.4 | 2.2 | 3.6 | 3.9 | 3.8 | 0.35 |
| Na (after heat treatment) amount D (atom %) in surface layer of glass substrate | 2.8 | 2.4 | 1.9 | 2.8 | 3.5 | 3.5 | 0.23 |
| Ratio D/C of Na in surface layer of glass substrate after to before heat treatment | 0.90 | 1.00 | 0.86 | 0.78 | 0.90 | 0.92 | 0.66 |
| $SO_2$ treatment condition | — | — | — | — | — | — | — |
| Cell efficiency (%) | 13.2 | 13.5 | 13.2 | (12.9) | (13.4) | (13.4) | (12.5) |
| Diffusion amount of Na in CIGS absorbing layer ($10^{17}$ atoms/cm$^3$) | 3.2 | 3.8 | 3.2 | (2.7) | (3.6) | (3.6) | (1.9) |

| wt % | Ex. 42 | Ex. 43 | Ex. 44 | Ex. 45 | Ex. 46 |
|---|---|---|---|---|---|
| $SiO_2$ | 62.5 | 63.0 | 63.0 | 64.5 | 57.5 |
| $Al_2O_3$ | 8.0 | 8.5 | 9.5 | 6.0 | 9.5 |
| MgO | 5.5 | 3.5 | 7.0 | 6.5 | 8.5 |
| CaO | 6.0 | 6.0 | 5.0 | 2.5 | 5.5 |
| SrO | 2.0 | 2.0 | 1.0 | 1.5 | 0.5 |
| BaO | 0.0 | 2.0 | 0.0 | 1.0 | 0.0 |
| $ZrO_2$ | 2.0 | 2.5 | 2.0 | 3.5 | 3.5 |
| $Na_2O$ | 6.0 | 5.0 | 3.0 | 5.0 | 6.0 |
| $K_2O$ | 8.0 | 7.5 | 9.5 | 9.5 | 9.0 |
| MgO + CaO + SrO + BaO | 13.5 | 13.5 | 13.0 | 11.5 | 14.5 |
| CaO + SrO + BaO | 8.0 | 10.0 | 6.0 | 5.0 | 6.0 |
| SrO + BaO | 2.0 | 4.0 | 1.0 | 2.5 | 0.5 |
| $Na_2O + K_2O$ | 14.0 | 12.5 | 12.5 | 14.5 | 15.0 |
| $Na_2O/(CaO + SrO + BaO)$ | 0.75 | 0.50 | 0.50 | 1.00 | 1.00 |

TABLE 5-continued

| | | | | | |
|---|---|---|---|---|---|
| Average thermal expansion coefficient ×10$^7$/° C. | 85 | 80 | 76 | 82 | 86 |
| Tg (° C.) | 626 | 640 | 676 | 630 | 646 |
| Amount A (atom %) of Ca + Sr + Ba in surface layer of glass substrate | 3.22 | 3.82 | 2.31 | 1.18 | 2.42 |
| Amount B (atom %) of Ca + Sr + Ba in inner portion of glass substrate | 3.4 | 4.0 | 2.4 | 1.2 | 2.6 |
| Ratio (A/B) of Ca + Sr + Ba in surface layer to that in inner portion of glass substrate | 0.95 | 0.95 | 0.96 | 0.98 | 0.93 |
| Na (before heat treatment) amount C (atom %) in surface layer of glass substrate | 3.8 | 3.2 | 1.9 | 3.2 | 3.8 |
| Na (after heat treatment) amount D (atom %) in surface layer of glass substrate | 3.3 | 2.8 | 1.7 | 2.8 | 3.5 |
| Ratio D/C of Na in surface layer of glass substrate after to before heat treatment | 0.87 | 0.88 | 0.89 | 0.88 | 0.92 |
| SO$_2$ treatment condition | — | — | — | — | — |
| Cell efficiency (%) | (13.2) | (13.3) | (13.3) | (13.3) | (13.5) |
| Diffusion amount of Na in CIGS absorbing layer (10$^{17}$ atoms/cm$^3$) | (3.3) | (3.3) | (3.5) | (3.3) | (3.7) |

In Tables 1 to 5, values in parentheses are calculated values.

The cell efficiency and the Na diffusion amount were specifically calculated as follows.

The cell efficiency was obtained from a regression formula obtained by plot of the ratio of Na in the surface layer of the glass substrate after to before heat treatment and cell efficiency. The Na diffusion amount was obtained from a regression formula obtained by plot of the ratio of Na after to before heat treatment and cell efficiency.

The specific regression formulae are the following formula (2), formula (3) and formula (4).

Providing x, y and z represent the following:
x: After to before ratio of Na
y: Cell efficiency [%]
z: Na diffusion amount [$10^{17}$ atoms/cm$^3$]

<Cell Efficiency>
In the case of the SO$_2$ treatment was carried out:

$$y = 1.4 \times \ln(x) + 12.5 \quad (2)$$

In the case where no SO$_2$ treatment was carried out:

$$y = 4.3 \times x + 9.5 \quad (3)$$

<Na Diffusion Amount>

$$z = 1.9 \times y - 21.7 \quad (4)$$

As is evident from Tables 1 to 4, each glass of Working Examples (Examples 1, 2 and 7 to 30) has the ratio of Ca+Sr+Ba in the surface layer to that in the inner portion of the glass substrate of at most 0.35, the ratio of Na in the surface layer of the glass substrate after to before heat treatment of at least 1.5, and a high glass transition temperature Tg. Accordingly both a high cell efficiency and a high glass transition temperature may be obtained.

Further, since the average thermal expansion coefficient of the glass of each Working Examples is from 70×10$^{-7}$ to 100×10$^{-7}$/° C., when a solar cell is assembled (specifically, when a glass substrate having a CIGS absorbing layer and a cover glass are bonded together by heat), the glass substrate is less likely to be deformed, and a stable cell efficiency may be obtained.

On the other hand, in the case of the glass in a Comparative Example (Example 3), although the glass was subjected to the SO$_2$ treatment since Na$_2$O/(CaO+SrO+BaO) is 1.62 i.e. large, the ratio of Na in the surface layer of the glass substrate after to before heat treatment is 0.98 i.e. small, and thus the cell efficiency tends to be low. In the case of the glass in Comparative Examples (Examples 31 and 32), although each glass is subjected to the SO$_2$ treatment since Na$_2$O/(CaO+SrO+BaO) is 1.62 i.e. large, the ratios of Ca+Sr+Ba in the surface layer to that in the inner portion of the glass substrate are 0.36 and 0.47 i.e. large, and the ratios of Na in the surface layer of the glass substrate after to before heat treatment are 1.15 and 0.92 i.e. small, and thus the power generation efficiencies tend to be low. Further, in the case of the glass of Comparative Examples (Examples 3, 31 and 32), since the Na$_2$O content is 13.1% i.e. large, Tg is below 580° C., and thus the substrate may be deformed at the time of film forming of CIGS, which may affect production of cells.

Further, in the case of the glass of Comparative Examples (Examples 33 and 34), although the glass is subjected to the SO$_2$ treatment since the Na$_2$O amount is 0.5% i.e. small, the Na diffusion amount is also small, and the cell efficiency is also low.

Further, as is evident from Tables 1 to 5, in the case of each glass of Comparative Examples (Examples 4 to 5, 35 to 40 and 42 to 46) which is not subjected to the SO$_2$ treatment, although the composition of the respective raw materials is within the range of the present invention, since the glass is not subjected to the SO$_2$ treatment, the ratio of Ca+Sr+Ba in the surface layer to that in the inner portion of the glass substrate is from 0.90 to 1.00 i.e. large, and the ratio of Na in the surface layer of the glass substrate after to before heat treatment is from 0.78 to 1.00 i.e. small, and thus the cell efficiency tends to be low.

In the case of the glass of Comparative Example (Example 6), since $Na_2O/(CaO+SrO+BaO)$ is 1.62 i.e. large, and the glass is not subjected to the $SO_2$ treatment, the ratio of Ca+Sr+Ba in the surface layer to that in the inner portion of the glass substrate is 0.97 i.e. large, and the ratio of Na in the surface layer of the glass substrate after to before heat treatment is 0.67 i.e. small, and thus the cell efficiency tends to be low. Further, since the $Na_2O$ content is 13.1% i.e. large, Tg is below 580° C., and the substrate may be deformed at the time of film forming of CIGS, which may affect production of cells.

In the case of the glass of Comparative Example (Example 41), since the glass is not subjected to the $SO_2$ treatment, the ratio of Na in the surface layer of the glass substrate after to before heat treatment is 0.66 i.e. small, and the $Na_2O$ amount is 0.5% i.e. small, and thus the Na diffusion amount is also small and the cell efficiency is also low.

Industrial Applicability

The glass substrate for a vapor-deposited Cu—In—Ga—Se film solar cell of the present invention is suitable as a glass substrate or a cover glass for a vapor-deposited CIGS film solar cell, and it may also be used as a substrate or a cover glass for another solar cell.

Further, when the glass substrate for a vapor-deposited Cu—In—Ga—Se film solar cell of the present invention is used, it is possible to provide a solar cell having a good cell efficiency.

This application is a continuation of PCT Application No. PCT/JP2011/066878, filed on Jul. 25, 2011, which is based upon and claims the benefit of priority from Japanese Patent Application No. 2010-167026 filed on Jul. 26, 2010. The contents of those applications are incorporated herein by reference in its entirety.

Reference Symbols

1: Solar cell
5: Glass substrate
7: Positive electrode
9: CIGS layer
11: Buffer layer
13: Transparent conductive film
15: Negative electrode
17: Antireflection film
19: Cover glass

What is claimed is:

1. A glass substrate, comprising:
a substrate having a surface and comprising a glass material,
wherein the glass material has a glass transition temperature of at least 580° C. and an average thermal expansion coefficient of from $70\times10^{-7}$ to $100\times10^{-7}$/° C.,
the substrate comprises at least one of CaO, SrO and BaO such that a ratio of an average total amount in atom % of Ca, Sr and Ba within from 10 to 40 nm in depth from the surface of the substrate to a total amount in atom % of Ca, Sr and Ba at 5,000 nm in depth from the surface of the substrate is at most 0.35,
the substrate comprises $Na_2O$ such that a ratio of an average Na amount in atom % within from 10 to 40 nm in depth from the surface of the substrate after a heat treatment at 600° C. under a $N_2$ atmosphere for 1 hour to an average Na amount before the heat treatment is at least 1.5, and
the substrate comprises, at 5,000 nm or more in depth from the surface of the substrate, as represented by mass % based on oxides, from 53 to 72% of $SiO_2$, from 1 to 15% of $Al_2O_3$, from 0.5 to 9% of MgO, from 0.1 to 11% of CaO, from 0 to 11% or SrO, from 0 to 11% or BaO, from 2 to 11% of $Na_2O$, from 2 to 21% of $K_2O$ and from 0 to 10.5% of $ZrO_2$, provided that MgO+CaO+SrO+BaO is from 4 to 25%, CaO+SrO+BaO is from 2 to 23%, $Na_2O$+$K_2O$ is from 8 to 22%, and $Na_2O/(CaO+SrO+BaO)\leq1.2$.

2. The glass substrate according to claim 1, wherein the ratio of the average total amount in atom % of Ca, Sr and Ba within from 10 to 40 nm in depth from the surface of the substrate to the total amount in atom % of Ca, Sr and Ba at 5,000 nm in depth from the surface of the substrate is at most 0.17, and in the substrate, at 5,000 nm or more in depth from the surface of the substrate, as represented by mass % based on oxides, $K_2O$ is from 4 to 21%, $ZrO_2$ is from 0.5 to 10.5%, and CaO+SrO+BaO is from 4 to 23%.

3. The glass substrate according to claim 1, wherein the ratio of the average total amount in atom % of Ca, Sr and Ba within from 10 to 40 nm in depth from the surface of the substrate to the total amount in atom % of Ca, Sr and Ba at 5,000 nm in depth from the surface of the substrate is at most 0.05, the ratio of the average Na amount in atom % within from 10 to 40 nm in depth from the surface of the substrate after a heat treatment at 600° C. under a $N_2$ atmosphere for 1 hour to the average Na amount before the heat treatment is at least 2.0, and in the substrate, at 5,000 nm or more in depth from the surface of the glass substrate, as represented by mass % based on oxides, CaO+SrO+BaO is from 4 to 15%, and SrO+BaO is from 0 to 8%.

4. The glass substrate according to claim 1, wherein the ratio of the average Na amount in atom % within from 10 to 40 nm in depth from the surface of the substrate after a heat treatment at 600° C. under a $N_2$ atmosphere for 1 hour to the average Na amount before the heat treatment is at least 2.

5. The glass substrate according to claim 1, wherein the ratio of the average total amount in atom % of Ca, Sr and Ba within from 10 to 40 nm in depth from the surface of the substrate to the total amount in atom % of Ca, Sr and Ba at 5,000 nm in depth from the surface of the substrate is at most 0.17, the ratio of the average Na amount in atom % within from 10 to 40 nm in depth from the surface of the substrate after a heat treatment at 600° C. under a $N_2$ atmosphere for 1 hour to the average Na amount before the heat treatment is at least 2.4, and in the substrate, at 5,000 nm or more in depth from the surface of the substrate, as represented by mass % based on oxides, CaO+SrO+BaO is from 2 to 15%, and SrO+BaO is from 0 to 10%.

6. A solar cell comprising:
a glass substrate;
a cover glass; and
a Cu—In—Ga—Se absorbing layer disposed between the glass substrate and the cover glass,
wherein between the glass substrate and the cover glass, at least the glass substrate is the glass substrate as defined in claim 1.

7. The glass substrate according to claim 1, wherein the ratio of the average Na amount in atom % within from 10 to 40 nm in depth from the surface of the substrate after a heat treatment at 600° C. under a $N_2$ atmosphere for 1 hour to the average Na amount before the heat treatment is at least 2.5 and at most 4.5.

8. The glass substrate according to claim 1, wherein the ratio of the average Na amount in atom % within from 10 to 40 nm in depth from the surface of the substrate after a heat treatment at 600° C. under a $N_2$ atmosphere for 1 hour to the average Na amount before the heat treatment is at least 2.7 and at most 4.

9. The glass substrate according to claim 1, wherein the substrate comprises, at 5,000 nm or more in depth from the surface of the substrate, as represented by mass % based on oxides, from 59 to 63% of $SiO_2$, and from 8 to 12% of $Al_2O_3$.

10. The glass substrate according to claim 8, wherein the substrate comprises, at 5,000 nm or more in depth from the surface of the substrate, as represented by mass % based on oxides, from 59 to 63% of $SiO_2$, and from 8 to 12% of $Al_2O_3$.

11. The glass substrate according to claim 1, wherein the substrate comprises, at 5,000 nm or more in depth from the surface of the substrate, as represented by mass % based on oxides, from 59 to 63% of $SiO_2$, from 8 to 12% of $Al_2O_3$, from 3 to 6.5% of MgO, and from 4.5 to 7% of CaO, provided that MgO+CaO+SrO+BaO is from 4 to 25%, CaO+SrO+BaO is from 2 to 23%, $Na_2O+K_2O$ is from 8 to 22%, and $Na_2O/(CaO+SrO+BaO) \leq 1.2$.

12. The glass substrate according to claim 8, wherein the substrate comprises, at 5,000 nm or more in depth from the surface of the substrate, as represented by mass % based on oxides, from 59 to 63% of $SiO_2$, from 8 to 12% of $Al_2O_3$, from 3 to 6.5% of MgO, and from 4.5 to 7% of CaO, provided that MgO+CaO+SrO+BaO is from 4 to 25%, CaO+SrO+BaO is from 2 to 23%, $Na_2O+K_2O$ is from 8 to 22%, and $Na_2O/(CaO+SrO+BaO) \leq 1.2$.

13. The glass substrate according to claim 1, wherein the glass material comprises at least one of SrO, BaO, and $ZrO_2$.

14. The glass substrate according to claim 12, wherein the glass material comprises at least one of SrO, BaO, and $ZrO_2$.

15. The glass substrate according to claim 14, wherein the glass material comprises SrO, BaO, and $ZrO_2$.

16. A solar cell, comprising:
a glass substrate;
a cover glass; and
a Cu—In—Ga—Se absorbing layer disposed between the glass substrate and the cover glass,
wherein between the glass substrate and the cover glass, at least the glass substrate is substrate as defined in claim 15.

* * * * *